(12) United States Patent
Miyamoto et al.

(10) Patent No.: US 9,418,910 B2
(45) Date of Patent: Aug. 16, 2016

(54) SEMICONDUCTOR DEVICE

(75) Inventors: Noboru Miyamoto, Tokyo (JP); Naoki Yoshimatsu, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 18 days.

(21) Appl. No.: 14/385,311

(22) PCT Filed: Jul. 5, 2012

(86) PCT No.: PCT/JP2012/067219
§ 371 (c)(1),
(2), (4) Date: Sep. 15, 2014

(87) PCT Pub. No.: WO2014/006724
PCT Pub. Date: Jan. 9, 2014

(65) Prior Publication Data
US 2015/0035138 A1 Feb. 5, 2015

(51) Int. Cl.
*H01L 23/34* (2006.01)
*H01L 23/31* (2006.01)
(Continued)

(52) U.S. Cl.
CPC ............. *H01L 23/31* (2013.01); *H01L 23/16* (2013.01); *H01L 23/3142* (2013.01); *H01L 23/34* (2013.01); *H01L 23/3735* (2013.01); *H01L 23/4334* (2013.01); *H01L 23/49562* (2013.01); *H01L 23/49575* (2013.01);
(Continued)

(58) Field of Classification Search
CPC .......... H01L 2924/01079; H01L 2224/48091; H01L 2924/01078; H01L 2924/01029; H01L 23/4334
See application file for complete search history.

(56) References Cited

U.S. PATENT DOCUMENTS

| 4,835,598 A * | 5/1989 | Higuchi | H01L 23/142 257/659 |
| 5,767,573 A * | 6/1998 | Noda | H01L 23/24 257/675 |
| 2005/0117302 A1* | 6/2005 | Emoto | H01L 23/367 361/704 |

FOREIGN PATENT DOCUMENTS

| JP | 2005-191178 A | 7/2005 |
| JP | 2006-032617 A | 2/2006 |
| JP | 2007-184315 A | 7/2007 |

OTHER PUBLICATIONS

Notification of Transmittal of Translation of the International Preliminary Report on Patentability and Translation of Written Opinion of the International Searching Authority; PCT/JP2012/067219; issued on Jan. 15, 2015.

(Continued)

*Primary Examiner* — Allen Parker
*Assistant Examiner* — Long Le
(74) *Attorney, Agent, or Firm* — Studebaker & Brackett PC

(57) ABSTRACT

A circuit pattern is bonded to a top surface of a ceramic substrate. A cooling body is bonded to an undersurface of the ceramic substrate. An IGBT and a FWD are provided on the circuit pattern. A coating film covers a junction between the ceramic substrate and the circuit pattern, and a junction between the ceramic substrate and the cooling body. A mold resin seals the ceramic substrate, the circuit pattern, the IGBT, the FWD, the cooling body, and the coating film etc. The ceramic substrate has higher thermal conductivity than the coating film. The coating film has lower hardness than the mold resin and alleviates stress applied from the mold resin to the ceramic substrate. The circuit pattern and the cooling body includes a groove contacting the mold resin without being covered with the coating film.

3 Claims, 3 Drawing Sheets

(51) Int. Cl.
- *H01L 23/16* (2006.01)
- *H01L 25/07* (2006.01)
- *H01L 23/373* (2006.01)
- *H01L 23/433* (2006.01)
- *H01L 23/495* (2006.01)
- *H01L 25/18* (2006.01)

(52) U.S. Cl.
CPC .......... *H01L 25/072* (2013.01); *H01L 23/3121* (2013.01); *H01L 25/18* (2013.01); *H01L 2224/40137* (2013.01); *H01L 2924/1305* (2013.01); *H01L 2924/13055* (2013.01)

(56) References Cited

OTHER PUBLICATIONS

An Office Action issued by the German Patent Office on Jul. 13, 2015, which corresponds to German Patent Application No. 112012006656.1 and is related to U.S. Appl. No. 14/385,311; with English language partial translation.

International Search Report; PCT/JP2012/067219; Sep. 4, 2012.

An Office Action; "Notice of Reasons for Rejection," issued by the Japanese Patent Office on Sep. 15, 2015, which corresponds to Japanese Patent Application No. 2014-523501 and is related to U.S. Appl. No. 14/385,311; with English language partial translation.

\* cited by examiner

US 9,418,910 B2

SEMICONDUCTOR DEVICE

TECHNICAL FIELD

The present invention relates to a resin-sealed type semiconductor device sealed with mold resin.

BACKGROUND ART

In a resin-sealed type semiconductor device using a ceramic substrate, peeling occurs between mold resin and the ceramic substrate. Furthermore, when stress applied from the mold resin to the ceramic substrate is large, there is a concern about long-term reliability. Therefore, various techniques are proposed such as a technique that provides a groove or protrusion in a metal base plate to enhance adhesion to resin and a technique that provides a coating film less harder than mold resin over the entire region of an interface with the mold resin to alleviate stress (e.g., see Patent Literature 1).

CITATION LIST

Patent Literature

Patent Literature 1: Japanese Patent Application Laid-Open No. 2007-184315

SUMMARY OF INVENTION

Technical Problem

However, according to the technique that provides a groove or protrusion in the metal base plate, the metal base plate has a complicated shape and this technique is not applicable to a structure which uses no metal base plate. On the other hand, the technique that provides a coating film over the entire region requires an inspection of the occurrence of any uncoated portion over the entire region and a rework such as re-coating for the uncoated portion. This results in a problem that manufacturing is difficult.

The present invention has been implemented to solve the above-described problems and it is an object of the present invention to provide a semiconductor device capable of preventing peeling, improving reliability and facilitating manufacturing.

Means for Solving the Problems

A semiconductor device according to the present invention includes: an insulating substrate having first and second main surfaces facing each other; a circuit pattern bonded to the first main surface of the insulating substrate; a cooling body bonded to the second main surface of the insulating substrate; a semiconductor element on the circuit pattern; a coating film covering a junction between the insulating substrate and the circuit pattern, and a junction between the insulating substrate and the cooling body; and a resin sealing the insulating substrate, the circuit pattern, the semiconductor element, the cooling body, and the coating film, wherein the insulating substrate has higher thermal conductivity than the coating film, the coating film has lower hardness than the resin and alleviates stress applied from the resin to the insulating substrate, and at least one of the circuit pattern and the cooling body includes a groove or a protrusion contacting the resin without being covered with the coating film.

Advantageous Effects of Invention

The present invention makes it possible to prevent peeling, improve reliability and facilitate manufacturing.

DESCRIPTION OF EMBODIMENTS

A semiconductor device according to the embodiments of the present invention will be described with reference to the drawings. The same components will be denoted by the same symbols, and the repeated description thereof may be omitted.

Embodiment 1

Figure 1:
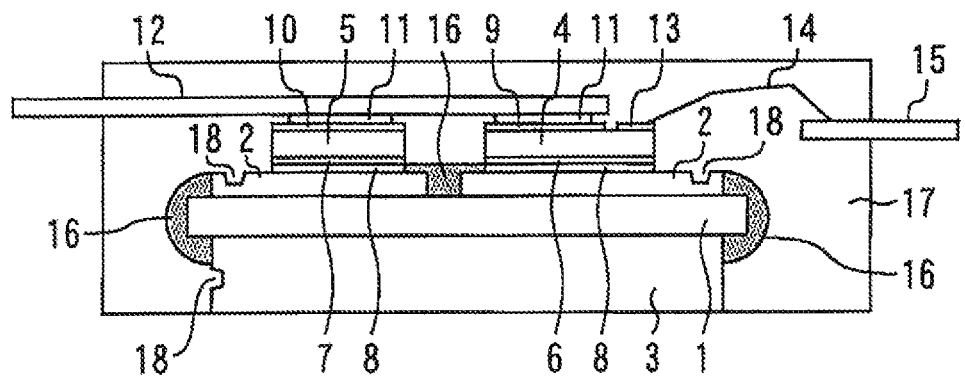
FIG. 1 is a cross-sectional view illustrating a semiconductor device according to Embodiment 1 of the present invention.
Figure 2:
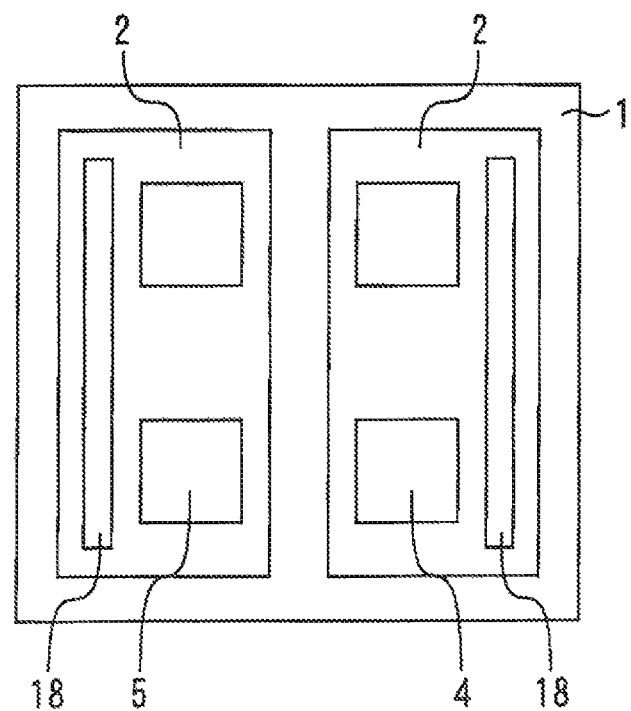
FIG. 2 is a plan view illustrating a structure on a ceramic substrate of the device in FIG. 1.

FIG. 1 is a cross-sectional view illustrating a semiconductor device according to Embodiment 1 of the present invention. FIG. 2 is a plan view illustrating a structure on a ceramic substrate of the device in FIG. 1. The ceramic substrate 1 has a top surface and an undersurface facing each other. A circuit pattern 2 is bonded to the top surface of the ceramic substrate 1. A metallic cooling body 3 is bonded to the undersurface of the ceramic substrate 1.

An IGBT 4 (Insulated Gate Bipolar Transistor) and an FWD 5 (Free Wheeling Diode) are mounted on the circuit pattern 2. A collector electrode 6 of the IGBT 4 and a cathode electrode 7 of the FWD 5 are bonded to the top surface of the circuit pattern 2 via solder 8. An emitter electrode 9 of the IGBT 4 and an anode electrode 10 of the FWD 5 are bonded to a high-voltage electrode 12 via solder 11. A gate electrode 13 of the IGBT 4 is electrically connected to a signal electrode 15 via an aluminum wire 14. A control signal is inputted to the IGBT 4 from a higher system (not shown) via the signal electrode 15.

A coating film 16 covers a junction between the ceramic substrate 1 and the circuit pattern 2 and a junction between the ceramic substrate 1 and the cooling body 3. Mold resin 17 seals the ceramic substrate 1, the circuit pattern 2, the IGBT 4, the FWD 5, the cooling body 3 and the coating film 16 or the like. In this way, the IGBT 4 or the like is insulated from the outside. However, the undersurface of the cooling body 3 is exposed from the mold resin 17. By cooling the undersurface of the cooling body 3 by a heat sink (not shown), the IGBT 4 and the FWD 5 are cooled.

Here, the ceramic substrate 1 is made of, for example, AlN, alumina, SiN or the like. The coating film 16 is made of, for example, polyimide resin (coefficient of linear expansion of on the order of 50 ppm, elastic coefficient of on the order of 2.6 GPa). The mold resin 17 is, for example, epoxy resin (coefficient of linear expansion of on the order of 16 ppm, elastic coefficient of on the order of 16 GPa). The circuit pattern 2, the high-voltage electrode 12 and the cooling body 3 are made of, for example, Cu.

The ceramic substrate 1 has higher thermal conductivity than the coating film 16. The coating film 16 has lower hardness than the mold resin 17 and thereby alleviates stress applied from the mold resin 17 to the ceramic substrate 1. The circuit pattern 2 and the cooling body 3 include grooves 18 contacting the mold resin 17 without being covered with the coating film 16.

Next, effects of the present embodiment will be described. By mounting the IGBT 4 and the FWD 5 on the ceramic substrate 1 having high thermal conductivity, it is possible to secure heat dissipation properties. Moreover, by covering the ceramic substrate 1 with the coating film 16 which has lower hardness than the mold resin 17, it is possible to alleviate stress applied from the mold resin 17 to the ceramic substrate 1, and thereby improve reliability.

In addition, since adhesion between the coating film 16 and the ceramic substrate 1 or the mold resin 17 is stronger than adhesion between the ceramic substrate 1 and the mold resin 17, it is possible to prevent peeling between the ceramic substrate 1 and the mold resin 17.

Here, the coating film 16 need not be applied to the entire surface, but needs only to be applied to the necessary part. Therefore, work whereby the necessary portion including the unnecessary portion is always coated is possible. Even when an inspection of the occurrence of any uncoated portion in the coating film 16 or rework is performed, the region to be inspected or reworked can be reduced. As a result, it is possible to save time and effort, and facilitate manufacturing.

Furthermore, at least one wedge-shaped groove 18 is provided in the circuit pattern 2 and the cooling body 3. The mold resin 17 enters this groove 18, and it is thereby possible to prevent peeling of the mold resin 17. However, a wedge-shaped protrusion may also be provided instead of the groove 18. Without being limited to this, a groove or protrusion may be provided in at least one of the circuit pattern 2 and the cooling body 3.

Figure 3:
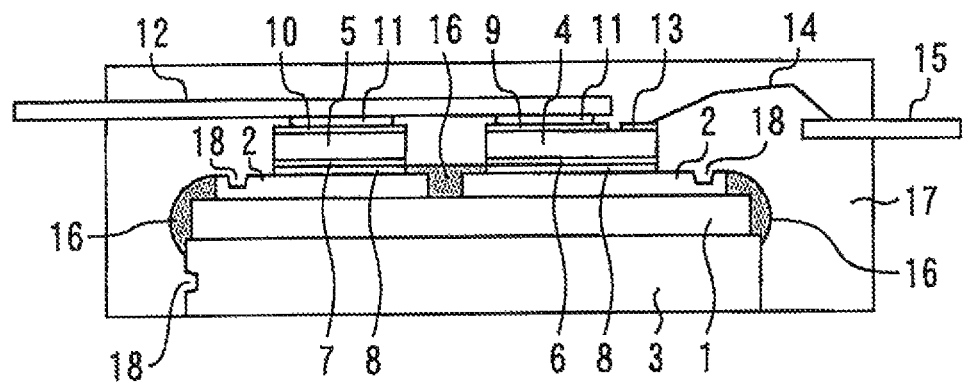
FIG. 3 is a cross-sectional view illustrating a modification of the semiconductor device according to Embodiment 1 of the present invention.

FIG. 3 is a cross-sectional view illustrating a modification of the semiconductor device according to Embodiment 1 of the present invention. The lateral width of the cooling body 3 is equal to or greater than the lateral width of the ceramic substrate 1. Therefore, the whole ceramic substrate 1 can be fitted in the region of the cooling body 3 in a plan view. This ensures that stress applied to the ceramic substrate 1 is released to the cooling body 3, and can thereby further improve reliability.

Embodiment 2

Figure 4:
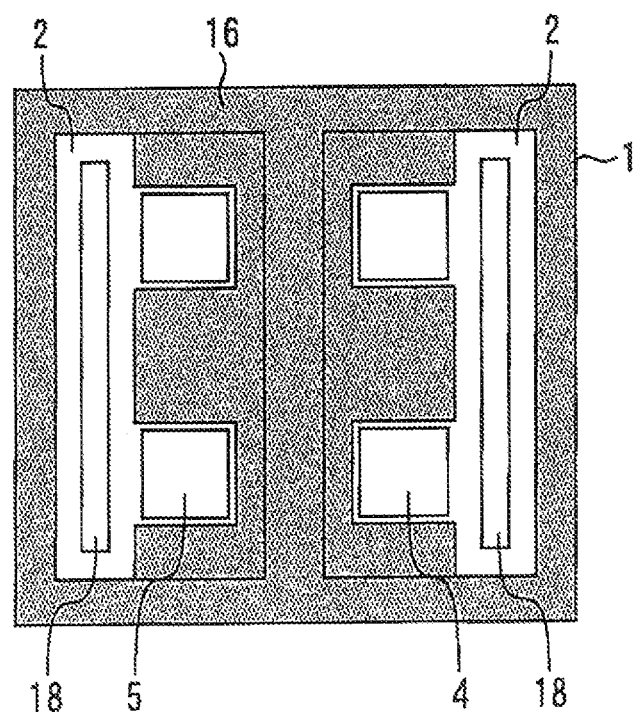
FIG. 4 is a plan view illustrating a structure on a ceramic substrate of a semiconductor device according to Embodiment 2 of the present invention.

FIG. 4 is a plan view illustrating a structure on a ceramic substrate of a semiconductor device according to Embodiment 2 of the present invention. The coating film 16 surrounds a region in which the IGBT 4 and the FWD 5 are mounted on the top surface of the circuit pattern 2.

In this way, the coating film 16 has a function as a resist for positioning when the IGBT 4 and the FWD 5 are soldered. This eliminates the necessity for forming a resist separately from the coating film 16, and can thereby reduce the number of steps of manufacturing.

Embodiment 3

Figure 5:
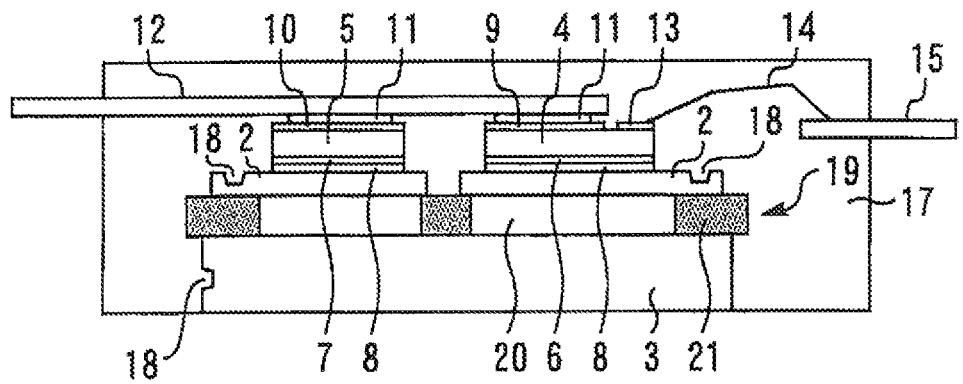
FIG. 5 is a cross-sectional view illustrating a semiconductor device according to Embodiment 3 of the present invention.
Figure 6:
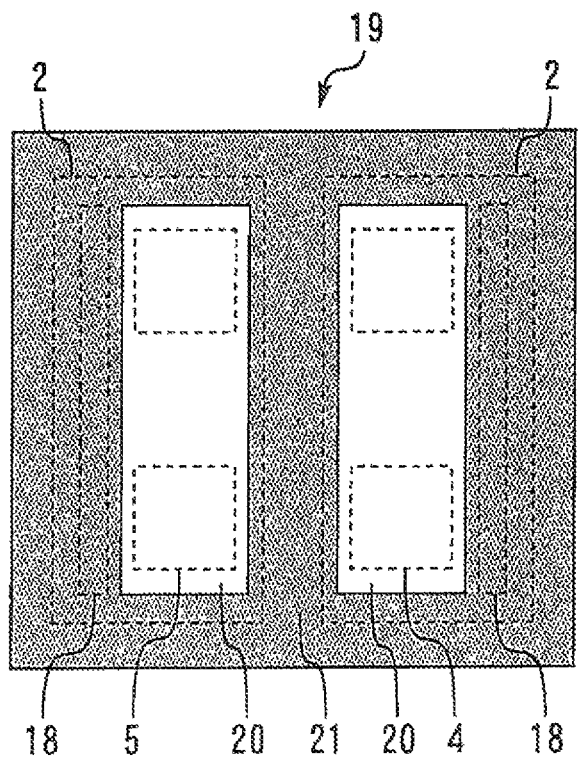
FIG. 6 is a plan view illustrating a ceramic substrate of the device in FIG. 5.

FIG. 5 is a cross-sectional view illustrating a semiconductor device according to Embodiment 3 of the present invention. FIG. 6 is a plan view illustrating a ceramic substrate of the device in FIG. 5. An insulating substrate 19 includes an insulating plate 20 disposed directly below and peripheral to the IGBT 4 and the FWD 5 and an insulating resin 21 disposed between the mold resin 17 and the insulating plate 20. Strictly speaking, the insulating plate 20 is disposed within a thermal conduction range which spreads at an angle of 45 degrees from the mounting positions of the IGBT 4 and the FWD 5.

The insulating plate 20 is made of, for example, AN, alumina, SiN or the like. The insulating resin 21 is, for example, polyimide resin (coefficient of linear expansion of on the order of 50 ppm, elastic coefficient of on the order of 2.6 GPa). Therefore, the insulating plate 20 has higher thermal conductivity than the insulating resin 21. Furthermore, the insulating resin 21 has lower hardness than the mold resin 17 and thereby alleviates stress applied from the mold resin 17 to the insulating plate 20.

Since the insulating plate 20 having high thermal conductivity is arranged directly below and peripheral to the IGBT 4 and the FWD 5, it is possible to secure heat dissipation properties. Moreover, since the insulating resin 21 having low hardness is disposed between the mold resin 17 and the insulating plate 20, it is possible to alleviate stress applied from the mold resin 17 to the insulating plate 20, and improve reliability.

In Embodiment 3, the lateral width of the cooling body 3 is preferably equal to or greater than the lateral width of the ceramic substrate 1. This allows stress applied to the ceramic substrate 1 to be released to the cooling body 3, and can further improve reliability.

Note that the IGBT 4 and the FWD 5 are not limited to those formed of silicon but may also be formed of a wide band-gap semiconductor having a band gap greater than that of silicon. The wide band-gap semiconductor is made of, for example, silicon carbide, gallium nitride-based material or diamond. A power semiconductor element formed of such a wide band-gap semiconductor has high withstand voltage or high allowable current density, and can thereby be downsized. Using this downsized element also makes it possible to downsize a semiconductor device incorporating this element. In addition, since the element exhibits high heat resistance, it is possible to downsize radiator fins of a heat sink, cool a water-cooling section, and thereby further downsize the semiconductor device. Moreover, since power loss of the element is low and high efficiency is achieved, it is possible to increase efficiency of the semiconductor device.

Description Of Symbols 1 ceramic substrate (insulating substrate)
2 circuit pattern
3 cooling body
4 IGBT (semiconductor element)
5 FWD (semiconductor element)
6 collector electrode (undersurface electrode)
7 cathode electrode (undersurface electrode)
8 solder
16 coating film
17 mold resin
18 groove
20 insulating plate (first part)
21 insulating resin (second part)

The invention claimed is:
1. A semiconductor device comprising:
an insulating substrate having first and second main surfaces facing each other;
a circuit pattern bonded to the first main surface of the insulating substrate;
a cooling body bonded to the second main surface of the insulating substrate;

a semiconductor element on the circuit pattern;

a coating film covering a junction between the insulating substrate and the circuit pattern, and a junction between the insulating substrate and the cooling body; and a resin sealing the insulating substrate, the circuit pattern, the semiconductor element, the cooling body, and the coating film, wherein the insulating substrate has higher thermal conductivity than the coating film, the coating film has lower hardness than the resin and alleviates stress applied from the resin to the insulating substrate, and at least one of the circuit pattern and the cooling body includes a groove or a protrusion contacting the resin without being covered with the coating film.

2. The semiconductor device according to claim 1, wherein an undersurface electrode of the semiconductor element is bonded to a top surface of the circuit pattern via solder, and the coating film surrounds a region in which the semiconductor element is mounted on the top surface of the circuit pattern.

3. The semiconductor device according to claim 1, wherein a lateral width of the cooling body is equal to or greater than a lateral width of the insulating substrate.

* * * * *